Figure 1:
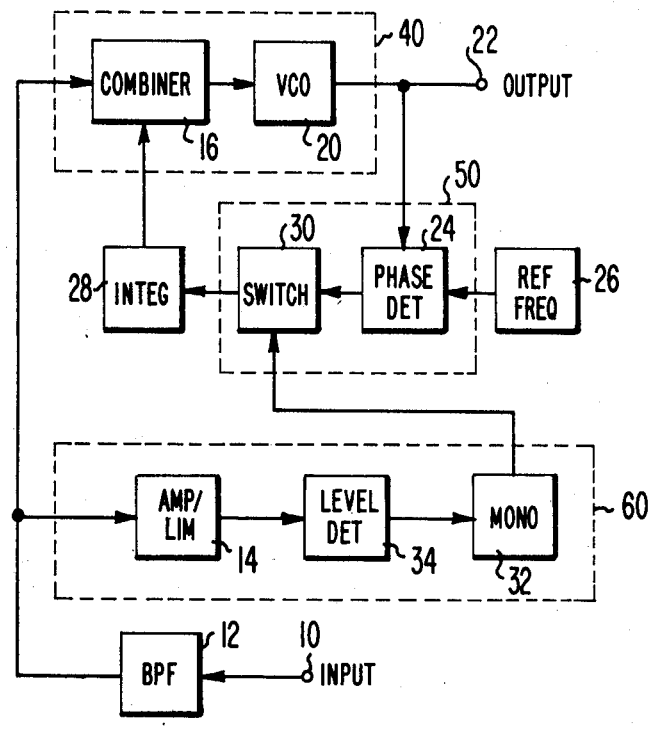

United States Patent [19]

James

[11] 4,286,237
[45] Aug. 25, 1981

[54] WIDE RANGE DRIFT COMPENSATED FM SIGNAL GENERATOR

[75] Inventor: Jack E. James, Indianapolis, Ind.

[73] Assignee: RCA Corporation, New York, N.Y.

[21] Appl. No.: 85,869

[22] Filed: Oct. 18, 1979

[51] Int. Cl.³ .............................................. H03C 3/06
[52] U.S. Cl. ...................................... 332/19; 331/23; 332/16 R; 455/113
[58] Field of Search ..................... 332/19, 16 R, 23 R, 332/16 T, 18; 331/23; 455/113, 126

[56] References Cited

U.S. PATENT DOCUMENTS

| | | | |
|---|---|---|---|
| 3,393,380 | 7/1968 | Webb | 332/19 |
| 3,414,842 | 12/1968 | Broadhead, Jr. | 332/19 |
| 3,480,883 | 11/1969 | Gaunt, Jr. | 332/19 |
| 3,622,913 | 11/1971 | Shipley | 331/23 X |
| 4,006,429 | 2/1977 | Talbot | 332/19 X |
| 4,009,455 | 2/1977 | Ishigaki et al. | 455/113 X |
| 4,052,672 | 10/1977 | Enderby et al. | 332/19 X |
| 4,074,209 | 2/1978 | Lysobey | 332/19 |

Primary Examiner—Siegfried H. Grimm
Assistant Examiner—Edward P. Westin
Attorney, Agent, or Firm—E. M. Whitacre; J. S. Tripoli; R. G. Coalter

[57] ABSTRACT

The output frequency of a variable frequency oscillator is compared with that of a reference frequency source by means of a phase detector and the resultant error signal is integrated and applied as a negative feedback signal to the input of the oscillator whereby drift of the oscillator output frequency is minimized. Deviation, modulation index, dynamic stability and linearity are enhanced by means of a pulse generator that is synchronized with a modulating input signal supplied to the oscillator for supplying a keying signal to the phase detector during a portion of each cycle of the modulating input signal.

11 Claims, 2 Drawing Figures

WIDE RANGE DRIFT COMPENSATED FM SIGNAL GENERATOR

This invention relates to FM signal generators and particularly to wide range drift compensated FM signal generators.

Phase lock loop (PLL) techniques are known for minimizing drift of FM signal generators. In an elementary form of such a stabilized generator, the modulating input signal is applied to a voltage controlled oscillator (VCO) for producing an FM output signal, the phase of which is compared with that of a reference frequency source by means of a phase detector and the resultant error signal is low-pass filtered and applied as a negative feedback signal to the VCO input thereby forming a phase locked loop which minimizes center frequency drift of the FM signal generator.

One difficulty with the generator described above is that certain of its parameters (such as bandwidth and modulation index) are dependent to a great extent on parameters of the phase lock loop (e.g., loop bandwidth, dynamic stability, and the lock range capability of the loop phase detector). As an illustration, consider the case where it is desired that the generator operate with a modulation index $M_f$ of 10. In terms of phase shift, this would correspond to an output signal phase shift of ten radians for each radian of phase change of the modulating signal and in terms of frequency deviation it would correspond to 10 Hz of output frequency deviation for each 1 Hz input frequency change. The difficulty is that conventional phase detectors (the exclusive - OR type, the four-quadrant multiplier type, etc.) may exhibit an unambiguous phase lock range of substantially less than 10 radians. Accordingly, loss of phase lock (and thus loss of drift compensation) can occur in PLL type FM signal generators when the modulation index is so high as to exceed the lock range capability of the loop phase detector. As a result, the aforementioned elementary form of FM signal generator may be limited to applications requiring only a relatively low value of modulation index.

Techniques are known for extending the range of PLL stabilized FM signal generators beyond the lock range of the phase detector. One approach is disclosed in U.S. Pat. No. 3,414,842 entitled "Frequency Modulated Reference Controlled Oscillator" which issued Dec. 3, 1968 to S. L. Broadhead, Jr. There the VCO output is divided prior to the phase comparison and the reference frequency is reduced in value by an amount proportioned to the division factor. As a result, phase excursions in the phase detector are reduced compared to phase variations in the VCO in proportion to the division factor so that the phase detector may be operated well within its unambiguous phase detection range. (Broadhead gives the example that with a division factor of 100, a VCO phase excursion of 10 radians is reduced to only 0.1 radian as sensed by the phase detector.)

A different approach is disclosed in U.S. Pat. No. 3,480,883 entitled "Frequency Modulated Phase Locked Oscillator" which issued Nov. 25, 1969 to W. B. Gaunt, Jr. There, a fixed frequency carrier signal is applied to the phase detector of the first of a cascaded series of frequency modulated phase locked loops. The phase detector reference frequency for each succeeding loop in the cascade connection is obtained from the FM output signal of the immediately preceeding loop and the loop modulating input signals are obtained from a cascade connection of amplifiers arranged to apply increased modulating input signal to each succeeding one of the cascade connected loops. Using this approach, a relatively high overall modulation index may be achieved by including sufficient numbers of phase locked loops in the cascade connection, each operated at a relatively low modulation index. (Gaunt suggests that the modulation index for each individual loop should be less than 2.41 which is the index at which the Bessel function Jo ($M_f$) is zero.)

In both of the examples given, means are provided for limiting the phase range of the signals supplied to the loop phase detector. In one example, this was achieved by a division process, in the other by cascade connecting plural phase lock loops. Since both the division factor and the number of stages to be cascaded is a function of the desired modulation index, the utility of such approaches depends to a certain extent upon prior knowledge of the modulation index for a specific application. This is a disadvantage in that it may be necessary to modify the generators when changing from one application to another.

A further difficulty with the cascaded PLL approach is that as more loops are added to increase the modulation index, each additional loop includes a VCO which may not be perfectly linear. The nonlinearities of the VCO's are cumulative so that the overall linearity of the generator may suffer as more VCO's are added. Further difficulties common to both approaches are that the loop bandwidth may influence the maximum permissible modulating signal bandwidth. Broadhead states that a solution to that problem would be to phase modulate the reference frequency source with the modulating input signal, but the process of phase modulation itself may introduce nonlinearities and further complicate the generator.

The present invention is directed to meeting the need for an FM signal generator having improved range over the elementary generator discussed above without resort to either cascaded PLL or divide-by-N techniques for improvement with respect to modulation index.

The invention may advantageously be practiced in FM signal generators of the kind comprising a variable frequency oscillator means for producing an output signal having a frequency related to a parameter of an input signal manifestation and a drift compensation circuit responsive to a reference frequency signal for regulating the frequency of the oscillator means. In accordance with the invention, the drift compensation circuit comprises a keyed phase detector means for comparing the output frequency of the oscillator with that of a reference signal and producing an error signal, means for integrating the error signal and applying the resultant integrated error signal to the oscillator and, in addition, a pulse generator means is provided which is synchronized with the modulating input signal for supplying a keying signal to the keyed phase detector means.

In accordance with a further aspect of the invention the pulse generator means is synchronized with zero axis crossings of the modulating input signal.

Figure 2:
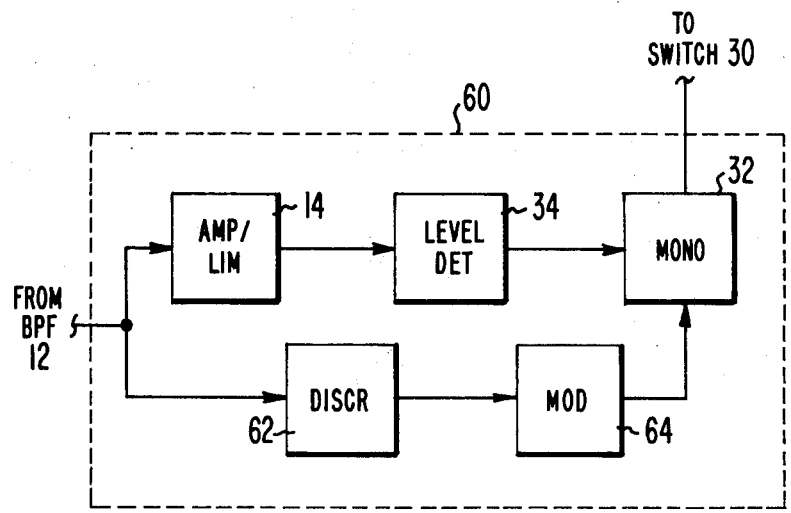

In the drawings:

FIG. 1 is a block diagram of a wide range PLL stabilized FM signal generator embodying the invention; and FIG. 2 is a block diagram illustrating a modification of a portion of the FM signal generator of FIG. 1.

In FIG. 1, modulating signal input terminal 10 is coupled to the input of band pass filter 12 which is coupled at the output thereof to the input of amplifier-limiter (AMP LIM) 14 and to a first input of combiner 16. The output of combiner 16 is coupled to the input of voltage controlled oscillator (VCO) 20, the output of which is connected to the generator output terminal 22 and to a first input of phase detector 24, the second input of which connects to the output of reference frequency source (REF FREQ) 26. Integrator (INTEG) 28 has an output coupled to a second input of combiner 16 and an input coupled via switch 30 to the output of phase detector (PHASE DET) 24. Monostable multivibrator (MONO) 32 is coupled at the output thereof to a control input of switch 30 and at the input thereof to the output of amplifier-limiter 14 via level detector (LEVEL DET) 34.

In operation, a modulating input signal applied to modulating input signal terminal 10 is band pass filtered by filter 12 so as to remove its d.c. component and high frequency components above the highest expected modulating input frequency. It is advantageous to remove the d.c. component of the modulating input signal in certain applications such as audio frequency applications since it essentially has no information content and might degrade the symmetry of the output signal of amplifier limiter 14. On the other hand, where the modulation is a video input signal the d.c. component may have substantial information content and, it may be desirable to replace band pass filter 12 with a low pass filter (not shown) to preserve it. If that is done, it may be desirable to apply bias of an appropriate level to amplifier limiter 14 to preserve symmetry. The purpose of removing high frequency components of the modulating input signal is to prevent noise or transients which may accompany the modulating signal from creating output signal sidebands of greater width than the channel capacity of the utilization device (not shown) which may be connected to output terminal 22.

Combiner 16 and VCO 20 together form a variable frequency oscillator 40 (outlined in phantom) which produces an FM output signal at output terminal 22 having a frequency proportional to the filtered modulating signal produced at the output of band pass 12. As will be explained in more detail subsequently, the purpose of combiner 16 is to combine the output of integrator 28 with the modulating signal in a sense to produce negative feedback in the loop including VCO 20, phase detector 24, switch 30 and integrator 28 for providing drift compensation for VCO 20. To accomplish this, combiner 16 may be either an adder or a substractor depending on the frequency-polarity characteristics of phase detector 24 and VCO 20 and whether integrator 28 is of the inverting or non-inverting kind.

To illustrate, if the output frequency of VCO 20 increases with increasing input voltage and if the output voltage of phase detector 24 increases for center frequency drift above the reference frequency produced by source 26 and if integrator 28 is of the inverting kind (i.e., an operational amplifier with a capacitor in its feedback loop and input signal applied to its inverting input terminal) then the loop feedback will be negative if combiner 16 is of the non-inverting type. In that case, combiner 16 could be implemented by means of a simple resistive summing circuit. Alternatively, if the net phase characteristics of elements 20, 24, 30 and 28 are such that feedback within the loop would be positive then one could obtain inversion to achieve negative feedback by utilizing a subtractor for combiner 16. Another alternative would be to delete combiner 16 altogether and select a VCO having differential inputs for VCO 16. If that were done, one would apply the integrator output to the inverting input and the modulating signal to the non-inverting input of the VCO where the loop feedback was positive (to convert to negative) or reverse the connections where the feedback was already negative.

Implementation of VCO 20 is not critical and any suitable voltage or current controlled oscillator having the required frequency range for a given application may be used. It should be appreciated that if VCO 20 is replaced by a current controlled oscillator then combiner 16 should be of the current output type rather than of the voltage output type. One could, for example, implement combiner 16 with an operational transconductance amplifier (OTA). Such amplifiers are well-known and commercially available.

Phase detector 24 compares the output frequency of variable frequency oscillator 40 with that of a reference signal produced by reference frequency source 26 and produces an error signal which is passed to integrator 28 when switch 30 is closed in response to a keying signal produced by monostable multivibrator 32. Phase detector 24 and switch 30 taken together thus comprise a "keyed" phase detector (i.e., one that is enabled by the presence of the keying signal and inhibited by its absence). Rather than employing a continuously acting phase detector and a series switch for this purpose one could, alternatively, implement keyed phase detector 50 by means of a four quadrant multiplier or doubly balanced mixer by controlling the multiplier (mixer) "tail current" in accordance with the keying signal. Switch 30 may be implemented by conventional devices such as bipolar or field effect transistor transmission gates. A preferred form of phase detector is an edge triggered type such as that used in the type CD4046 phase lock loop integrated circuit which features a tristate output circuit and provides a lock range approaching $2\pi$ radians and is not prone to lock on harmonics (as is the exclusive-OR type).

Integrator 28 provides the functions of integrating the error signal produced by keyed phase detector 40 and applying the resultant integrated error signal as a negative feedback signal to the variable frequency oscillator means 40. Integrator 28 may thus be viewed as a kind of memory which accumulates the error signal during the period the keyed phase detector is enabled by the presence of the keying signal produced by monostable multivibrator 32 and which stores the error signal during the period the keyed phase detector is not enabled.

Storage of the error signal is an important aspect of the invention and for this reason, the low-pass filters used in conventional PLL stabilized FM generators mentioned earlier are not satisfactory substitutes for integrator 28. Low pass filters are sometimes loosely referred to as "integrators" because they do exhibit a temporary storage characteristic. However, as used herein, the term integrator is used in its proper sense to mean an element capable of accumulating information during a given time interval and storing or holding it during another time interval. A capacitor could be used for this purpose and operational amplifier integrators of the type employing a capacitor in the amplifier feedback loop (through which all feedback current flows) are preferred. At the expense of complexity, integrator 28 could be constructed with digital elements (i.e., a suitably interfaced up-down counter) if desired.

The remaining elements of FIG. 1 comprise a pulse generator 60 which provides the function of opening and closing the feedback loop around VCO 20. Timing of this operation is very important and must be synchronized with the modulating input signal. In more detail, amplifier-limiter 14 amplifies and limits the modulating input signal and level detector 34 detects transitions of the amplified and limited signal relative to a predetermined voltage level. It is preferred that the voltage level be equal to the average level of the modulating signal in order to detect the maximum number of transitions possible within any given period of time. If the d.c. component of the modulating signal is zero volts (it is in the example shown because of the presence of BPF 12), then level detector 34 should be set to produce an output pulse at axis (zero) crossings of the amplified and limited modulating signal. The output pulses are then applied as trigger pulses to monostable multivibrator 32 which in turn supplies keying signals to keyed phase detector 50.

It is preferred that level detector 34 be of a type for detecting transitions through zero in either direction of the amplified and limited modulating signal so as to maximize the number of keying pulses produced. This could be done by means of an exclusive-OR gate having one input coupled directly to the output of amplifier limiter 14 and the other input coupled via a delay element to the same point. Alternatively, a pair of comparators having slightly different threshold values could be used to produce staggered output pulses which could then be coupled to an exclusive-OR gate to produce a pulse at each axis crossing.

The function of amplifier-limiter 14 is to reduce what will be referred to herein as the aperture error of level detector 34. Level detector 34, as mentioned previously, produces an output pulse as the modulating signal passes through zero. Since this is a level comparison process the width of the trigger pulse is a function of the slew rate of the modulating signal and represents a "window" or "aperture" period which occupies a portion of each cycle of the modulating signal. The error in positioning and width of this window is thus a function of both the amplitude and the frequency of the modulating signal since both of those parameters affect slew rate. Amplifier limiter 14 minimizes the sensitivity of the aperture error to both amplitude and frequency of the modulating signal by maximizing the signal slew rate prior to level detection.

It is instructive to note that the phase locked loop formed by elements 40, 50 and 28 is closed only during the period that the modulating input signal is substantially zero volts. At all other times VCO 20 operates without restriction or limitation and integrator 28 maintains the previous value of correction voltage to the VCO input. Becuase of this, the loop parameters (such as bandwidth and phase lock range) do not limit the modulation index of the FM signal generator as in the previously discussed systems.

In FIG. 2, pulse generator 60 has been modified to include a frequency discriminator (DISCR) 62 and a modulator (MOD) 64 connected in cascade in that order with the input of discriminator 62 coupled to the input of amplifier limiter 14 for receiving the band pass filtered modulating signal from band pass filter 12. The output of modulator 64 is connected to a modulation input of monostable multivibrator 32.

In the previous example of the invention, multivibrator 32 produced an output pulse of fixed width at each axis crossing of the modulating signal. At higher modulating frequencies the fixed pulse width corresponds to a greater portion of the period of the modulating signal than at the lower frequencies and as a result the loop gain tends to increase with frequency. The modification of FIG. 2 avoids this by changing the pulse width of the keying signal in proportion to the period of the modulating signal. Discriminator 62 produces an output signal proportional to the frequency of the modulating signal and supplies a control signal to modulator 64 which in turn acts upon multivibrator 32 to decrease the width of the keying signal as the frequency of the modulating signal increases thereby maintaining the loop gain again constant.

In the examples given, pulse generator 60 includes a zero crossing triggered monostable multivibrator 32 for supplying keying signals to keyed phase detector 50. Multivibrators are not essential to implementation of pulse generator 60 and other suitable pulse producing means may be employed instead. One such alternative would be a symmetrical axis crossing detector of the type producing output pulses substantially centered about the axis crossings. Illustratively, one could implement such a detector or pulse generator by applying the output of limiter amplifier 14 to a pair of comparators, one referenced to a positive level and the other to a negative level, and combining the comparator outputs with a suitable gate such that the gate produces an output signal when the modulating signal lies within the region defined by the positive and negative reference levels (or any two different levels). Circuits of this type are well-known and are commonly referred to as "dead zone" detectors. Another alternative would be to replace level detector 34 and monostable multivibrator 32 with a symmetrical zero crossing detector of the type utilized in the type CA3058, CA3059 or CA3079 "Zero Voltage Switches" (see for example, p.p. 161-165 of the 1976 RCA Databook SSD210).

What is claimed is:

1. An improved FM signal generator comprising a variable frequency oscillator means for producing an output signal having a frequency proportional to the amplitude of a modulating input signal and a drift compensation circuit responsive to a reference frequency signal for regulating the frequency of said oscillator means, the improvement wherein said drift compensation circuit comprises:

keyed phase detector means responsive to a keying signal supplied thereto for comparing the output frequency of said oscillator means with that of said reference signal and producing an error signal;

means for integrating said error signal and applying the resultant integrated error signal as a negative feedback signal to said oscillator means; and pulse generator means synchronized with said modulating input signal for supplying said keying signal to said keyed phase detector means.

2. An improved FM signal generator as recited in claim 1 wherein said pulse generator means is synchronized with zero crossings of said modulating input signal.

3. An improved FM signal generator as recited in claim 1 wherein said keying signal produced by said pulse generator means is of predetermined width independent of the frequency of said modulating input signal.

4. An improved FM signal generator as recited in claim 1 wherein said pulse generator means comprises:
   axis crossing detector means having an input to which said modulating input signal is applied and an output for producing a trigger signal at an axis crossing of said modulating input signal;
   multivibrator means responsive to said trigger signal produced by said axis crossing detector means for producing an output pulse of predetermined width; and
   means for applying said output pulse of predetermined width to said keyed phase detector means.

5. An improved FM signal generator as recited in claim 1 wherein said keying signal produced by said pulse generator means is of a width related to the period of said modulating input signal.

6. An improved FM signal generator as recited in claim 1 further comprising modulator means coupled to said pulse generator means and responsive to a parameter of said modulating input signal for modulating the width of said keying signal in accordance with said parameter.

7. An improved FM signal generator as recited in claim 1 wherein said keyed phase detector means comprises:
   digital phase comparator means having a substantially 360° phase comparison range and a tri-state output circuit, said tristate output circuit being coupled via a switch to said means for integrating said error signal, said switch being controlled by said keying signal.

8. An improved FM signal generator as recited in claim 1 wherein said pulse generator means comprises;
   amplifier means for amplifying said modulating input signal;
   level detector means responsive to the amplified modulating input signal for producing a trigger signal when said amplified modulating signal exceeds a threshold level in a given sense; and
   multivibrator means responsive to said trigger signal for producing said keying signal.

9. An FM signal generator comprising, in combination:
   controlled oscillator means responsive to a control signal supplied thereto for producing an FM output signal having a frequency proportional to said control signal;
   keyed phase detector means having a first input for receiving said FM output signal, a second input for receiving a reference signal of predetermined frequency, a third input for receiving a keying signal and an output for producing an error signal representative of the phase/frequency relationship of said FM output signal and said reference signal when said keying signal is present;
   memory means for accumulating said error signal during the period said keyed phase detector is enabled by the presence of said keying signal and for storing said error signal during the period said keyed phase detector is not enabled;
   means for combining a modulating input signal with the accumulated and stored error signal in said memory means and for applying the resultant signal as said control signal to said controlled oscillator means; and
   pulse generator means synchronized with said modulating input signal for supplying said keying signal to said keyed phase detector means at least once during each period of said modulating input signal.

10. An FM signal generator as recited in claim 9 wherein:
    said keyed phase detector means comprises a cascade connection of a continuously operated phase comparator and an electronic switch, said switch being controlled by said keying signal.

11. An FM signal generator as recited in claim 9 wherein said pulse generator means comprises:
    amplifier means for amplifying said modulating input signal;
    limiter means for limiting the amplified modulating input signal produced by said amplifier means;
    level detector means responsive to the limited and amplified modulating input signal produced by said limiter means for producing a trigger signal when said limited and amplified modulating input signal exceeds a threshold level in a given sense; and
    multivibrator means responsive to said trigger signal for producing said keying signal.

* * * * *